(12) United States Patent
Zhong

(10) Patent No.: US 7,608,342 B2
(45) Date of Patent: Oct. 27, 2009

(54) PHOTOCURABLE, CONDUCTIVE, TRANSPARENT POLYMER COATINGS

(75) Inventor: Xing-Fu Zhong, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 191 days.

(21) Appl. No.: 11/550,279

(22) Filed: Oct. 17, 2006

(65) Prior Publication Data

US 2007/0176152 A1 Aug. 2, 2007

Related U.S. Application Data

(60) Provisional application No. 60/739,722, filed on Nov. 23, 2005.

(51) Int. Cl.
*B32B 27/36* (2006.01)
*B32B 17/10* (2006.01)
*B32B 27/00* (2006.01)
*H01B 1/12* (2006.01)
*B05D 5/12* (2006.01)
*B05D 1/40* (2006.01)
*B05D 3/02* (2006.01)

(52) U.S. Cl. ............... 428/500; 428/412; 428/441; 428/515; 427/58; 427/96.1; 427/331; 427/372.2; 252/500

(58) Field of Classification Search .................. None
See application file for complete search history.

(56) References Cited

U.S. PATENT DOCUMENTS

| 5,552,216 | A | | 9/1996 | Sugimoto et al. |
| 5,916,669 | A | * | 6/1999 | Parker et al. ................. 428/216 |
| 2002/0195592 | A1 | * | 12/2002 | Geer et al. ................... 252/500 |
| 2006/0076541 | A1 | * | 4/2006 | Yoshida et al. .............. 252/500 |

OTHER PUBLICATIONS

H.C. Starck (HCST), A Bayer MaterialScience Company, Baytron® P Materials. Includes Product Information (4 pages), Chemical Information (1 page), Product Specification (1 page), Characteristics, Properties and Applications (3 pages): Types (1 page), Baytron® P HS Product Specification (1 page), and P HS Chemical Information (1 page), 12 pages total, http://www.baytron.com (formerly http://www.hcstarch-echemicals.com).
Sartomer Materials for SR-9035. Includes Product Bulletin (1 page), Product Detail (1 page), and Material Safety Data Sheet (7 pages), 9 pages total, http://www.sartomer.com.
Sartomer Materials for SR-415. Includes Product Detail (1 page), Technical Data Sheet (1 page), and Material Safety Data Sheet (7 pages), 9 pages total, http://www.sartomer.com.
Sartomer Materials for SR-399. Includes Product Bulletin (1 page), Product Detail (1 page), and Material Safety Data Sheet (7 pages), 9 pages total, http://www.sartomer.com.
Sartomer Materials for CN-997. Includes Product Detail (1 page), Technical Data Sheet (1 page), and Material Safety Data Sheet (7 pages), 9 pages total, http://www.sartomer.com.
Ciba® IRGACURE® 184 Materials. Ciba Specialty Chemicals: Coating Effects Segment, 4 pages, http://www.cibasc.com/pf/pf_tn.asp?ind=01&sind=12&tn=IRGACURE+184.

* cited by examiner

*Primary Examiner*—Sheeba Ahmed
(74) *Attorney, Agent, or Firm*—Hovey Williams LLP

(57) ABSTRACT

Photocurable, conductive, and transparent polymer coating compositions and methods of using the same are provided. The compositions include a photopolymer and an electrically conductive polymer dissolved or dispersed in a solvent system. Preferred photopolymers include water-miscible, multifunctional acrylates. Preferred electrically conductive polymers include poly(3,4-ethylenedioxythiophene)/poly(styrene sulfonate) (PEDOT-PSS). The compositions preferably also contain a photoinitiator and may contain a water-immiscible acrylate and/or a surfactant. The compositions are applied to substrates and exposed to actinic radiation such as ultraviolet (UV) light to form a cured, durable, conductive, and transparent coating.

56 Claims, No Drawings

PHOTOCURABLE, CONDUCTIVE, TRANSPARENT POLYMER COATINGS

RELATED APPLICATIONS

This applications claims the priority benefit of U.S. Patent Application No. 60/739,722, filed Nov. 23, 2005, entitled PHOTOCURABLE, CONDUCTIVE, TRANSPARENT POLYMER COATINGS, incorporated by reference herein.

FEDERALLY SPONSORED RESEARCH/DEVELOPMENT PROGRAM

This invention was made with government support under contract number N00421-03-C-0132 awarded by the U.S. Navy's Naval Air Warfare Center. The United States government has certain rights in the invention.

BACKGROUND OF THE INVENTION

1. Field of the Invention

The present invention is concerned with new compositions that can be formed into cured layers having high electrical conductivities and high light transparencies.

2. Description of the Prior Art

In general, polymer coatings are non-conductive, electrical insulators. However, electrostatic charge can accumulate on these coatings, causing electrostatic discharge (ESD) damage. This problem can be solved by imparting conductivity to the coatings. Electrically conductive coatings are needed for consumer, industrial, military, medical, and other applications. In one such conductivity-imparting process, metal particles such as silver or conductive carbon are added to polymer coatings to make them conductive. While this will render the coatings electrically conductive, it will also make them opaque. This is undesirable in many applications where the coatings need to be transparent. For example, it is imperative that these coatings be transparent when used on airplane windshields and canopies and in flat panel displays and other optoelectronic devices.

In another process, an intrinsically conductive polymer (ICP) can be added to the photopolymer coatings to make them conductive. The transparency of the coatings could generally be maintained if the amount of ICP added is small, however, it has been necessary to add larger quantities of ICP to obtain sufficient conductivity. The advantages of using photopolymers as coatings are their ability to cure rapidly at ambient temperatures and their ability to undergo direct patterning without using a photoresist and etching step.

In one prior art method of forming ICP/insulating polymer composites, UV-curable photopolymer/polyaniline composites were obtained by blending multifunctional acrylates, a photoinitiator, and a polyaniline dispersion, which was doped with special dopants. However, a high proportion of polyaniline was required to obtain significant conductivity, and this causes thick coatings to have a dark green color.

SUMMARY OF THE INVENTION

The present invention overcomes the problems in the prior art by providing a composition for use as a coating with high transparency and high electrical conductivity. The compositions broadly include a photopolymer (i.e., a polymer that undergoes a change such as further polymerization, crosslinking, etc. upon exposure to light) and an electrically conductive polymer dissolved or dispersed in a solvent system.

In more detail, preferred photopolymers are water-miscible, multi-functional polymers such as those selected from the group consisting of acrylates (e.g., urethane acrylates, polyester acrylates), methacrylates, and mixtures thereof. Preferred polymers include recurring monomers that comprise a hydrophilic functional group (A) and at least two groups (B) selected from the group consisting of acryloyl groups, methacrylol groups, and mixtures thereof. These groups can be on the same monomer or different monomers within the polymer.

The group (B) is preferably present in the photopolymer at a level of at least about 15% by weight, and preferably from about 20-25% by weight, based upon the total weight of the photopolymer taken as 100% by weight. The hydrophilic functional group (A) is preferably present in the photopolymer at a level of at least about 50%, and preferably from about 60-75% by weight, based upon the total weight of the photopolymer taken as 100% by weight. Preferred hydrophilic functional groups are those selected from the group consisting of ethylene oxides, carboxylic acids, sulfonic acids, and mixtures thereof. If ethylene oxides are the hydrophilic functional groups, it is preferred that there be at least about 10 moles, preferably at least about 15 moles, and even more preferably from about 20-25 moles of ethylene oxide per mole of polymer.

The most preferred acrylates are poly(ethylene glycol) diacrylate, poly(ethylene glycol) dimethacrylate, ethoxylated trimethylolpropane triacrylate, carboxylated urethane acrylate, and sulfonated urethane acrylate. One preferred photopolymer is sold under the name SR 9035 by Sartomer Chemical.

The photopolymer is preferably present in the composition at a level of from about 30-98% by weight, more preferably from about 40-60% by weight, and even more preferably from about 45-50% by weight, based upon the total weight of the solids in the composition taken as 100% by weight. Preferred photopolymers have a molecular weight of less than about 1,500 Daltons, preferably from about 700-1,200 Daltons, and even more preferably from about 800-1,000 Daltons.

Preferred electrically conductive polymers for use in the inventive compositions comprise thiophene monomers (e.g., 3,4-ethylenedioxythiophene). The thiophene monomers are preferably present in the electrically conductive polymer at a level of at least about 30% by weight, and preferably from about 40-60% by weight, based upon the total weight of the electrically conductive polymer taken as 100% by weight. Even more preferably, the polymers further comprise a dopant monomer such as sulfonate monomers, with styrene sulfonate monomers being particularly preferred. The dopant monomers are preferably present in the photopolymer at a level of at least about 5% by weight, and preferably from about 8-10% by weight, based upon the total weight of the electrically conductive polymer taken as 100% by weight.

The most preferred electrically conductive polymers comprise recurring monomers of poly(3,4-ethylenedioxythiophene)/poly(styrenesulfonate) (also known as PEDOT-PSS). Preferred electrically conductive polymers are sold under the name BAYTRON® P by H. C. Starck.

The electrically conductive polymer is preferably present in the composition at a level of less than about 1.1% by weight, more preferably from about 0.1-1.0% by weight, and even more preferably from about 0.3-0.7% by weight, based upon the total weight of the solids in the composition taken as 100% by weight. Preferred electrically conductive polymers have a molecular weight of at least about 10,000 Daltons, preferably from about 20,000-50,000 Daltons, and even more preferably from about 30,000-50,000 Daltons.

In one embodiment, the inventive compositions may also include a second acrylate, with this acrylate being different from the photopolymer in that the second acrylate is water-immiscible. As used herein, water-miscible means a substantially homogeneous phase is formed when mixed with water, and water-immiscible means that phase separation occurs when mixed with water.

Preferred water-immiscible polymers include recurring monomers comprising at least three groups (C) selected from the group consisting of acryloyl groups, methacryloyl groups, and mixtures thereof. The group (C) is preferably present in the water-immiscible polymer at a level of at least about 20% by weight, and preferably from about 30-40% by weight, based upon the total weight of the water immiscible polymer taken as 100% by weight. Examples of such water-immiscible polymers are those selected from the group consisting of pentaerythritol triacrylate, pentaerythritol trimethacrylate, pentaerythritol tetraacrylate, pentaerythritol tetramethacrylate, dipentaerythritol pentaacrylate, dipentaerythritol hexaacrylate, hexafunctional urethane acrylate, and mixtures thereof. A preferred water-immiscible polymer is sold under the name SR 399 by Sartomer Chemical.

The water-immiscible polymer, if included, is preferably present at levels of from about 0.1-68% by weight, and more preferably from about 40-60% by weight, based upon the total weight of the solids in the composition taken as 100% by weight. Preferred water-immiscible polymers have a molecular weight of from about 300-2,000 Daltons, preferably from about 500-1,500 Daltons, and even more preferably from about 600-1,000 Daltons.

Preferred solvent systems for use in the present invention include a first and second solvent, where the first and second solvents have respective boiling points that are less than about 5° C. apart, preferably less than about 3° C. apart, and even more preferably about the same. It is preferred that one of the solvents be water, and that the other solvent be an organic solvent such as 1-propanol, 2-butanol, and mixtures thereof. The solvent system preferably comprises from about 25-45% by weight water, and more preferably from about 30-40% by weight water, based upon the total weight of the solvent system taken as 100% by weight. The entire solvent system is preferably present in the composition at a level of from about 50-75% by weight, and more preferably from about 40-60% by weight, based upon the total weight of the composition taken as 100% by weight.

The inventive compositions also preferably comprise a photoinitiator. Preferred photoinitiators include at least one aromatic carbonyl group. Examples of suitable photoinitiators include benzoin, benzoin methyl ether, benzoin ethyl ether, 1-hydroxycyclohexyl phenyl ketone (e.g., IRGACURE® 184 available from Ciba), benzophenone, 4-(dimethylamino)benzophone, and 4,4'-(dimethylamino)benzophone (Michler's ketone). The photoinitiator is preferably present in the composition at a level of from about 0.5-8.0% by weight, more preferably from about 1.0-5.0% by weight, and even more preferably from about 1.5-3.0% by weight, based upon the total weight of the solids in the composition taken as 100% by weight.

The compositions can also include a number of optional ingredients such as surfactants, leveling agents, defoamers, and secondary dopants. If a surfactant is included, it can be anionic, cationic, or non-ionic, with fluorinated surfactants being a preferred type. Polymeric surfactants are also acceptable. Examples of suitable surfactants include FC-430 and FC-4430, available from 3M.

Coatings are formed by applying the compositions to a substrate by any conventional means (e.g., spin coating) to form a layer on the substrate. Substrates to which the compositions can be applied include those selected from the group consisting of flat panel displays, polycarbonate substrates, plastic substrates, glass substrates, acrylic substrates, microelectronic substrates, optoelectronic substrates, aircraft windshields, aircraft canopies, automobile windshields, and automobile windows.

After a layer of the composition is formed and dried on the substrate, it is cured by exposure to light at the appropriate wavelength. Generally UV light will be utilized, however, the present method can be used at wavelengths of from about 240-400 nm as well. Typical exposure times are from about 15-120 seconds, preferably from about 30-90 seconds, and more preferably about 60 seconds. The cured coating will generally have a thickness of from about 5-30 μm, and more preferably from about 15-20 μm.

It will be appreciated that the cured coatings have a number of highly desirable properties, including high transparencies and high electrical conductivities. At a thickness of about 30 μm, and preferably about 20 μm and at a wavelength of about 500 nm, cured coatings according to the invention will have a transparency of at least about 80%, preferably at least about 85%, and even more preferably at least about 90%. Furthermore, the electrical conductivity of the cured layer will be at least about $10^{-7}$ S/cm, preferably at least about $10^{-5}$ S/cm, and more preferably from about $10^{-4}$-$10^{-3}$ S/cm. As used herein, electrical conductivity is determined by the two-probe method. The two-probe conductivity measurement method involves vacuum depositing two parallel silver stripes onto a substrate. A layer of the polymer solution to be tested is then applied to the substrate between, and in contact with and covering, the two stripes to form a coated section that is rectangular in shape. The polymer solution coating is then dried and UV cured. The conductivity of the cured layer is determined by measuring the resistance between the two silver stripes, the thickness the polymer coating, the distance between the two stripes (i.e., the length of the coating edge that is essentially perpendicular to the stripes), and the length of polymer coating at the edge that is adjacent (essentially parallel) to the two stripes. These values are used to calculate conductivity according to the formula $$\text{Conductivity} = \frac{\text{Distance Between Stripes}}{(\text{Resistance}) * (\text{Coating Thickness}) * (\text{Coating Edge Length Parallel to Stripes})}.$$

The cured layers will have a pencil hardness (as determined by ASTM 3363) of at least about 7H, preferably at least about 8H, and even more preferably at least about 9H. Advantageously, the cured layers will also have superior adhesion, and will pass adhesions tests such as the one described in ASTM D 3359, Method B.

After curing, the substrates can be subjected to further processing steps as necessary for the particular application. For example, a photoresist could be applied to the layer and patterned according to conventional methods. Alternatively, the inventive composition itself could be patterned using a photomask during the light-exposing step discussed above.

DETAILED DESCRIPTION OF THE PREFERRED EMBODIMENT

The following examples set forth preferred methods in accordance with the invention. It is to be understood, however, that these examples are provided by way of illustration and nothing therein should be taken as a limitation upon the overall scope of the invention.

EXAMPLE 1

Preparation of Photocurable Coating 1

In this example, a photocurable coating was prepared by mixing 20 grams of SR9035 (trimethylolpropane ethoxylate triacrylate, a water-miscible photopolymer obtained from Sartomer Chemical) with 4 grams of SR399 (dipentaerythritol pentacrylate, obtained from Sartomer Chemical) and 0.69 grams of 1-hydroxy-cyclohexyl-phenyl-ketone (IRGACURE® 184, a photoinitiator obtained from Ciba Specialty Chemicals). The mixture was stirred magnetically for 30 minutes to obtain a homogeneous solution. While vigorously stirring, 5.85 grams of Baytron® P (a 1.3% dispersion of conductive polymer PEDOT-PSS in water, obtained from H.C. Starck) were added dropwise to the composition.

The mixture was spin-coated onto acrylic or glass substrates at 500 rpm for one minute to form films having respective thicknesses of less than 30 μm. The coatings were cured by exposing them to ultraviolet (UV) light for 1 minute, which resulted in bluish, transparent coatings. After UV exposure, the transmittance was measured at 500 nm on a UV-visible photometer to be 87.2%. Electrical conductivity was measured using the two-probe method and was found to be $1.1 \times 10^{-4}$ S/cm.

EXAMPLE 2

Preparation of Photocurable Coating 2

1. Preparation of Premix A

Premix A was formulated by adding 8.05 grams of deionized water and 28.58 grams of SR9035 to 12 grams of Baytron® P with vigorous stirring.

2. Preparation of Premix B

Premix B was prepared by stirring 20.13 grams of CN997 (a hexafunctional urethane acrylate, obtained from Sartomer Chemical), 1.52 grams of IRGACURE® 184, and 0.20 grams of FC-4430 (a fluorinated surfactant, obtained from 3M) in a shaker with 29.82 grams of 1-propanol for one hour to obtain a homogeneous solution. Premix B was then added dropwise to Premix A with vigorous stirring.

The mixture was spin-coated onto acrylic or glass substrates at 200 rpm for one minute to form films having respective thicknesses of less than 14 μm. The coatings were dried at 100° C. for 5 minutes and then exposed to UV light for one minute. After UV exposure, they were heated again at 100° C. for 5 minutes, which gave the coatings a bluish transparency. Electrical conductivity was measured and found to be $1.1 \times 10^{-7}$ S/cm.

EXAMPLE 3

Preparation of Photocurable Coating 3

1. Preparation of Premix A

Premix A was formulated by adding 12.38 grams of deionized water and 24.06 grams of SR415 (another trimethylolpropane ethoxylated triacrylate, obtained from Sartomer Chemical) to 7.82 grams of Baytron® P HS (a 4.0% dispersion of PEDOT-PSS in water, obtained from H.C. Starck) with vigorous stirring.

2. Preparation of Premix B

Premix B was formulated by mixing 25.08 grams of CN997, 1.55 grams of IRGACURE® 184, and 0.23 grams of FC-4430 in 29.81 grams of 1-propanol. The mixture was stirred in a shaker for 1 hour to obtain a homogeneous solution. Premix B was then added dropwise to Premix A with vigorous stirring.

The mixture was spin-coated onto acrylic or glass substrates at 200 rpm for one minute to form films having respective thicknesses of less than 18 μm. The coatings were dried at 100° C. for 5 minutes and then exposed to UV light for one minute. After UV exposure, the coatings were heated again at 100° C. for 5 minutes, which gave the coatings a bluish transparency. Electrical conductivity was found to be $2.1 \times 10^{-3}$ S/cm.

I claim:

1. An electrically conductive composition comprising a photopolymer and an electrically conductive polymer dissolved or dispersed in a solvent system, said electrically conductive polymer comprising thiophene monomers, wherein a cured layer of said composition has a percent transmittance of at least about 80% when having a thickness of about 30 μm and at a light wavelength of about 500 nm.

2. The composition of claim 1, wherein said electrically conductive polymer further includes monomers comprising sulfonate groups.

3. The composition of claim 1, wherein said thiophene monomers comprise 3,4-ethylenedioxythiophene.

4. The composition of claim 3, wherein said electrically conductive polymer comprises poly(3,4-ethylenedioxythiophene)/poly(styrenesulfonate).

5. The composition of claim 1, wherein said photopolymer is selected from the group consisting of acrylates, methacrylates, and mixtures thereof.

6. The composition of claim 5, wherein said photopolymer is an acrylate including recurring monomers comprising a hydrophilic functional group and at least two groups selected from the group consisting of acryloyl groups, methacrylol groups, and mixtures thereof.

7. The composition of claim 6, wherein said hydrophilic functional group is selected from the group consisting of ethylene oxides, carboxylic acids, and sulfonic acids.

8. The composition of claim 6, wherein said acrylate is selected from the group consisting of poly(ethylene glycol) diacrylate, poly(ethylene glycol) dimethacrylate, ethoxylated trimethyloipropane triacrylate, carboxylated urethane aclylate, and sulfonated urethane acrylate.

9. The composition of claim 1, said composition further comprising a water-immiscible acrylate.

10. The composition of claim 9, said water-immiscible acrylate being selected from the group consisting of pentaerythritol triacrylate, pentaerythritol trimethacrylate, pentaerythritol tetraacrylate, pentaerythritol tetramethacrylate, dipentaerythritol pentaacrylate, dipentaerythritol hexaacrylate, hexafunctional urethane acrylate, and mixtures thereof.

11. The composition of claim 1, wherein said solvent system comprises a first solvent and a second solvent, each of said first and second solvents having respective boiling points that are less than about 5° C. apart.

12. The composition of claim 11, wherein said first solvent is water and said second solvent is an organic solvent.

13. The composition of claim 12, wherein said solvent system comprises from about 25-45% by weight water, based upon the total weight of the solvent system taken as 100% by weight.

14. The composition of claim 12, wherein said second solvent is selected from the group consisting of 1-propanol, 2-butanol, and mixtures thereof.

15. The composition of claim 1, said composition further comprising a photoinitiator.

16. The composition of claim 1, said composition comprising less than about 1.1% by weight of said electrically conductive polymer, based upon the total weight of the solids in the composition taken as 100% by weight.

17. A method of forming an electrically conductive coating, said method comprising the step of applying a composition to a substrate, said composition comprising a photopolymer and an electrically conductive polymer dissolved or dispersed in a solvent system, said electrically conductive polymer comprising thiophene monomers, wherein a cured layer of said composition has a percent transmittance of at least about 80% when having a thickness of about 30 μm and at a light wavelength of about 500 nm.

18. The method of claim 17, wherein said substrate is selected from the group consisting of flat panel displays, polycarbonate substrates, plastic substrates, glass substrates, acrylic substrates, microelectronic substrates, optoelectronic substrates, aircraft windshields, aircraft canopies, automobile windshields, and automobile windows.

19. The method of claim 17, wherein said composition further comprises a photoinitiator and further comprising the step of exposing said composition to light after said applying step.

20. The method of claim 19, wherein said exposing step results in a cured layer of said composition.

21. The method of claim 19, wherein said exposing step results in a cured layer of said composition, said cured layer having an electrical conductivity of at least about $10^{-7}$ S/cm.

22. The method of claim 19, wherein said exposing step results in a cured layer of said composition, said cured layer having a hardness of at least about 7H.

23. The method of claim 17, wherein said electrically conductive polymer further includes monomers comprising sulfonate groups.

24. The method of claim 17, wherein said thiophene monomers comprise 3,4-ethylenedioxythiophene.

25. The method of claim 24, wherein said electrically conductive polymer comprises poly(3,4-ethylenedioxythiophene)/poly(styrenesulfonate).

26. The method of claim 17, wherein said photopolymer is selected from the group consisting of acrylates, methacrylates, and mixtures thereof.

27. The method of claim 26, wherein said photopolymer is an acrylate including recurring monomers comprising a hydrophilic functional group and at least two groups selected from the group consisting of acryloyl groups, methacrylol groups, and mixtures thereof.

28. The method of claim 27, wherein said hydrophilic functional group is selected from the group consisting of ethylene oxides, carboxylic acids, and sulfonic acids.

29. The method of claim 27, wherein said acrylate is selected from the group consisting of poly(ethylene glycol) diacrylate, poly(ethylene glycol) dimethacrylate, ethoxylated trimethyloipropane triacrylate, carboxylated urethane acrylate, and sulfonated urethane acrylate.

30. The method of claim 17, said composition further comprising a water-immiscible acrylate.

31. The method of claim 30, said water-immiscible acrylate being selected from the group consisting of pentaerythritol triacrylate, pentaerythritol trimethacrylate, pentaerythritol tetraacrylate, pentaerythritol tetramethacrylate, dipentacrythritol pentaacrylate, dipentaerythritol hexaacrylate, hexafunctional urethane acrylate, and mixtures thereof.

32. The method of claim 17, wherein said solvent system comprises a first solvent and a second solvent, each of said first and second solvents having respective boiling points that are less than about 5° C. apart.

33. The method of claim 32, wherein said first solvent is water and said second solvent is an organic solvent.

34. The method of claim 33, wherein said solvent system comprises from about 15-25% by weight water, based upon the total weight of the solvent system taken as 100% by weight.

35. The method of claim 33, wherein said second solvent is selected from the group consisting of 1-propanol, 2-butanol, and mixtures thereof.

36. The method of claim 17, said composition comprising less than about 1.1% by weight of said electrically conductive polymer, based upon the total weight of the solids in the composition taken as 100% by weight.

37. The combination of substrate having a surface and a layer of a composition adjacent said substrate surface, said composition comprising a photopolymer and an electrically conductive polymer dissolved or dispersed in a solvent system, said electrically conductive polymer comprising thiophene monomers, wherein said layer has a percent transmittance of at least about 80% when having a thickness of about 30 μm and at a light wavelength of about 500 nm.

38. The combination of claim 37, wherein said substrate is selected from the group consisting of flat panel displays, polycarbonate substrates, plastic substrates, glass substrates, acrylic substrates, microelectronic substrates, optoelectronic substrates, aircraft windshields, aircraft canopies, automobile windshields, and automobile windows.

39. The combination of claim 37, said cured layer has an electrical conductivity of at least about $10^{-7}$ S/cm.

40. The combination of claim 37, wherein said cured layer has a hardness of at least about 7H.

41. The combination of claim 37, wherein said electrically conductive polymer further includes monomers comprising sulfonate groups.

42. The combination of claim 37, wherein said thiophene monomers comprise 3,4-ethylenedioxythiophene.

43. The combination of claim 42, wherein said electrically conductive polymer comprises poly(3,4-ethylenedioxythiophene)/poly(styrenesulfonate).

44. The combination of claim 37, wherein said photopolymer is selected from the group consisting of acrylates, methacrylates, and mixtures thereof.

45. The combination of claim 44, wherein said photopolymer is an acrylate including recurring monomers comprising a hydrophilic functional group and at least two groups selected from the group consisting of acryloyl groups, methacrylol groups, and mixtures thereof.

46. The combination of claim 45, wherein said hydrophilic functional group is selected from the group consisting of ethylene oxides, carboxylic acids, and sulfonic acids.

47. The combination of claim 45, wherein said acrylate is selected from the group consisting of poly(ethylene glycol) diacrylate, poly(ethylene glycol) dimethacrylate, ethoxylated trimethylolpropane triacrylate, carboxylated urethane acrylate, and sulfonated urethane acrylate.

48. The combination of claim 37, said composition further comprising a water-immiscible acrylate.

49. The combination of claim 48, said water-immiscible acrylate being selected from the group consisting of pentaerythritol triacrylate, pentaerythritol trimethacrylate, pentaerythritol tetraacrylate, pentaerythritol tetramethacrylate, dipentaerythritol pentaacryl ate, dipentaerythritol hexaacrylate, hexafunctional urethane acrylate, and mixtures thereof.

50. The combination of claim 37, wherein said solvent system comprises a first solvent and a second solvent, each of said first and second solvents having respective boiling points that are less than about 5 C. apart.

51. The combination of claim 50, wherein said first solvent is water and said second solvent is an organic solvent.

52. The combination of claim 51, wherein said solvent system comprises from about 15-25% by weight water, based upon the total weight of the solvent system taken as 100% by weight.

53. The combination of claim 51, wherein said second solvent is selected from the group consisting of 1-propanol, 2-butanol, and mixtures thereof.

54. The combination of claim 37, said composition comprising less than about 1.1% by weight of said electrically conductive polymer, based upon the total weight of the solids in the composition taken as 100% by weight.

55. The composition of claim 1, said composition comprising from about 0.3-0.7% by weight of said electrically conductive polymer, based upon the total weight of the solids in the composition taken as 100% by weight.

56. The composition of claim 1, wherein said thiophene monomers arc present in said electrically conductive polymer at a level of at least about 30% by weight, based upon the total weight of the electrically conductive polymer taken as 100% by weight.

\* \* \* \* \*